(12) United States Patent
Nakazato

(10) Patent No.: US 8,183,684 B2
(45) Date of Patent: May 22, 2012

(54) SEMICONDUCTOR DEVICE AND METHOD OF MANUFACTURING THE SAME

(75) Inventor: Isao Nakazato, Kumagaya (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 126 days.

(21) Appl. No.: 12/532,321

(22) PCT Filed: Sep. 27, 2007

(86) PCT No.: PCT/JP2007/069426
§ 371 (c)(1),
(2), (4) Date: Sep. 21, 2009

(87) PCT Pub. No.: WO2008/117488
PCT Pub. Date: Oct. 2, 2008

(65) Prior Publication Data
US 2010/0090330 A1    Apr. 15, 2010

(30) Foreign Application Priority Data
Mar. 23, 2007  (JP) .................................. 2007-076846

(51) Int. Cl.
*H01L 23/488* (2006.01)
*H01L 21/60* (2006.01)
(52) U.S. Cl. ......... 257/692; 257/E23.023; 257/E21.509; 257/784; 438/121; 438/617
(58) Field of Classification Search ............... 257/692, 257/E23.023, E21.509, 784; 438/121, 612, 438/617
See application file for complete search history.

(56) References Cited

U.S. PATENT DOCUMENTS
| | | | |
|---|---|---|---|
| 2004/0191954 A1 | 9/2004 | Ano | |
| 2004/0262369 A1 | 12/2004 | Mii et al. | |
| 2005/0042855 A1 | 2/2005 | Ano | |
| 2007/0290372 A1* | 12/2007 | Lim | 257/784 |

FOREIGN PATENT DOCUMENTS
| | | |
|---|---|---|
| JP | 3276899 B2 | 4/2002 |
| JP | 2004-260065 A | 9/2004 |
| JP | 2004-289153 A | 10/2004 |
| JP | 2005-039192 A | 2/2005 |

OTHER PUBLICATIONS

Translation for JP2004260065.*
International Search Report of PCT/JP2007/069426, Mailing Date of Oct. 30, 2007.

* cited by examiner

*Primary Examiner* — Victor A Mandala
*Assistant Examiner* — Whitney T Moore
(74) *Attorney, Agent, or Firm* — Westerman, Hattori, Daniels & Adrian, LLP

(57) ABSTRACT

Provided is a thin semiconductor device using a thin metal wire and having a low top portion. The semiconductor device of the present invention has a structure in which a bonding pad 55 of a semiconductor chip 54 and an electrode 53B are connected to each other via a thin metal wire 51, and the thin metal wire 51 forms a curve portion 57. Specifically, the thin metal wire 51 exhibits the curve portion 57 from a first bond, and is provided with a linear second extending portion 60 with an end portion thereof being a first bend portion 59. A second bend portion 61 is located lower than a top portion 58 of the curve portion 57.

16 Claims, 6 Drawing Sheets

FIG.4A
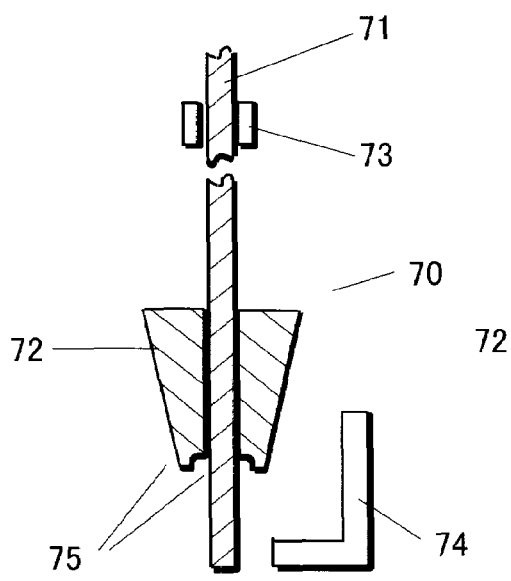
FIG.4B
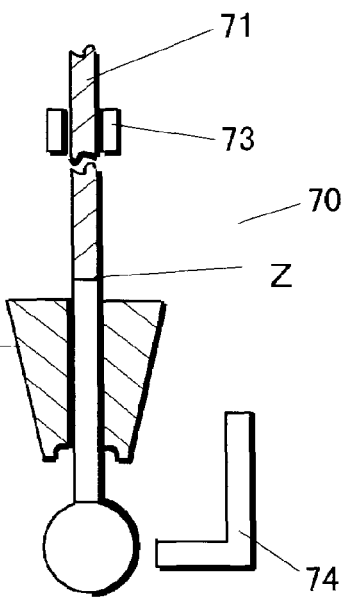
FIG.4C
| MATERIAL NAME | SPARK CURRENT | DISCHARGE TIME | HAZ RECRYSTALLIZED PORTION | LOOP HEIGHT |
|---|---|---|---|---|
| GLF:23 μm | 27.5mA | 0.5m sec | 110-130 μm | 62 μm |
| GMG:23 μm | 27.5 | 0.5 | 150-170 | 70 |

FIG.5
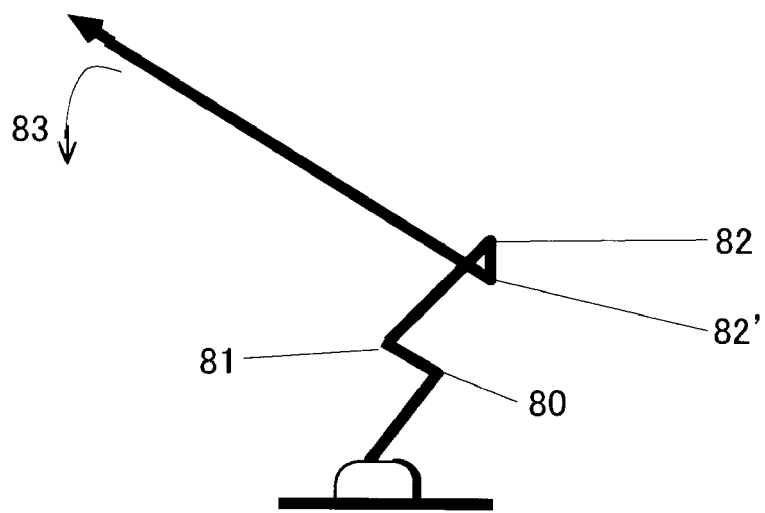
FIG.6A    FIG.6B    FIG.6C
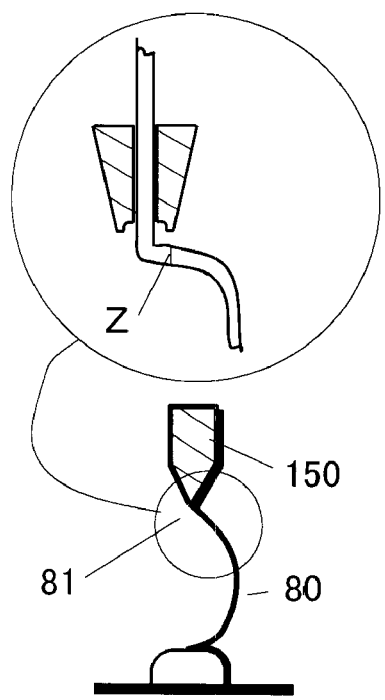
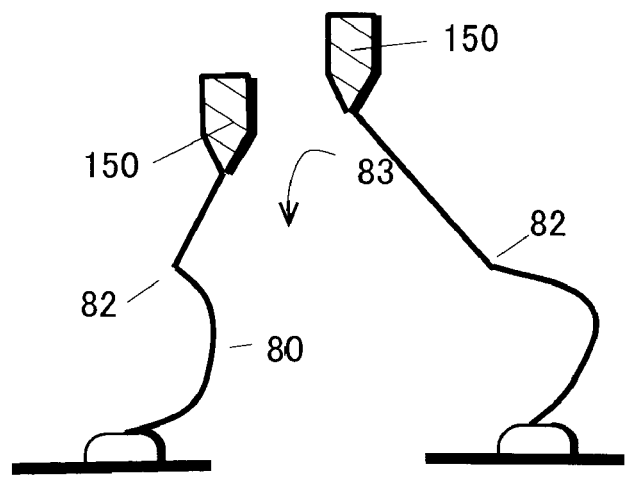

FIG.7A
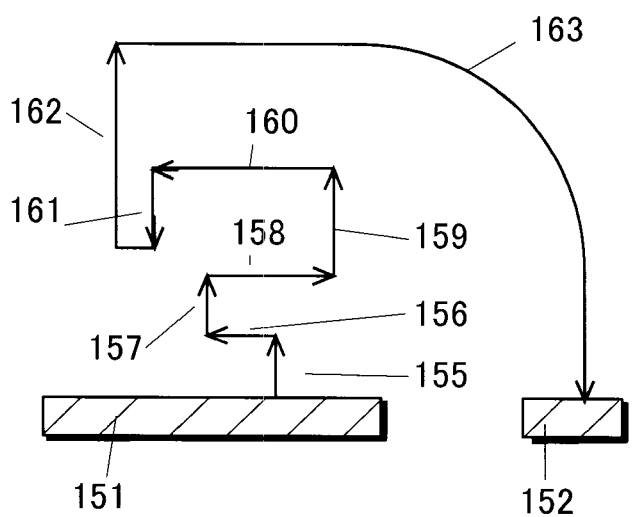
FIG.7B
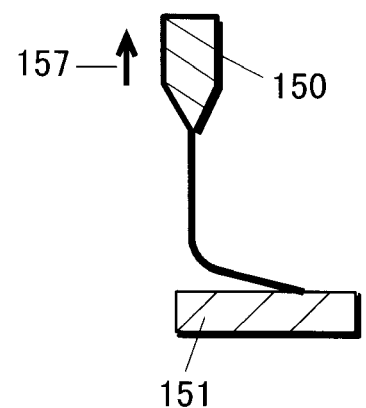
FIG.7C  FIG.7D  FIG.7E  FIG.7F
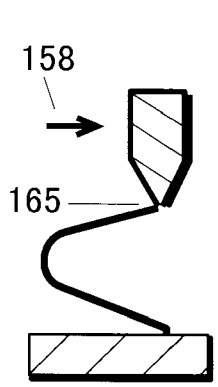 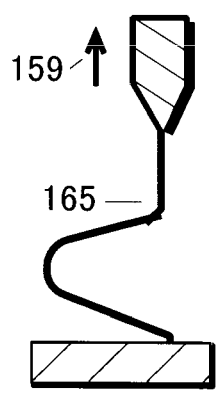 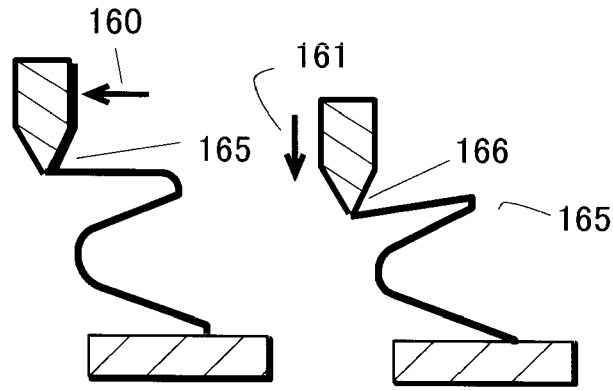
FIG.7G  FIG.7H
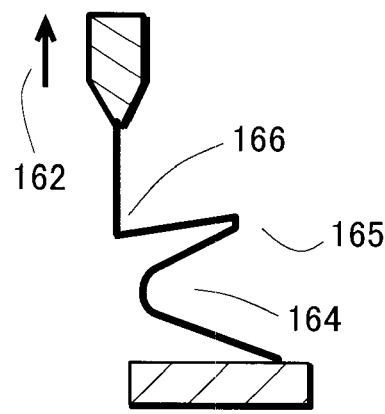 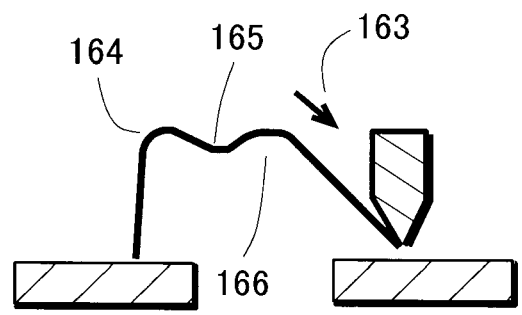

SEMICONDUCTOR DEVICE AND METHOD OF MANUFACTURING THE SAME

This application claims priority from Japanese Patent Application Number JP 2007-76846 filed on Mar. 23, 2007, the content of which is incorporated herein by reference in its entirety.

TECHNICAL FIELD

The present invention relates to a semiconductor device employing a thin metal wire and to a method of manufacturing the same.

BACKGROUND ART

While high functionalization of portable electronic equipment such as mobile phones, PDAs, DVCs and DSCs is being accelerated in recent years, reduction in size and weight has become indispensable in order for such products to be accepted in a market. Furthermore, in global warming, there are demanded products which are manufactured by use of least possible resources, and thereby pose no environmental burden. Naturally, lighter, thinner and smaller semiconductor devices are also required to achieve further reduction of materials.

Meanwhile, in order to meet the demand for thinner semiconductor devices, some semiconductor devices are manufactured without using thin metal wires, but by using conductive plates instead of flip chip mounting and the thin metal wires. Nevertheless, a technique for bonding the thin metal wires has been cultivated over a long history and is a highly reliable technique, thus being still employed.

For example, FIG. 8 is a cross-sectional view of a typical semiconductor device 100 constituted of a semiconductor chip 102 fixed onto an island 101, a lead 103 placed around the island 101 with one end of the lead 103 located close to the island 101, a thin metal wire 104A (or 104B) which electrically connects a bonding pad of the semiconductor chip 102 and the lead 103, a resin 105 which encapsulates the island 101, the semiconductor chip 102, the lead 103 and the thin metal wire 104A.

Two types of thin metal wires 104 are shown here. One shown by a dotted line is the thin metal wire 104A having a triangular loop, which has been employed since early times, whereas one shown by a solid line is the thin metal wire 104B having an M-loop.

The former thin metal wire 104A has a considerably high top portion 106. For this reason, in order to accommodate the semiconductor device 100 in a thin package, the top portion 106 needs to be lowered. However, when the top portion 106 is lowered, the thin metal wire 104A extended obliquely from the top portion 106 is likely to short-circuit to the semiconductor chip 102.

To avoid this, there has been invented a metal wire in such a shape that the height of a wire loop is reduced and additionally short-circuit to the semiconductor chip is prevented. This is called an M-loop, and disclosed in Japanese Patent No. 3276899, for example.

With reference to FIG. 7, a description is given of a method of manufacturing the thin metal wire 104B having a shape of the above mentioned M-loop. FIG. 7A is a view showing a trajectory of a capillary 150, and FIGS. 7B to 7H are views each showing what shape the thin metal wire forms in accordance with the trajectory. In addition, an arrow placed for the capillary 150 in FIG. 7B represents the reference numeral and the direction of the arrow in FIG. 7A. For example, the arrow 157 in FIG. 7B is the third arrow in FIG. 7A, and is marked with the same reference numeral. In other words, the arrow shown in FIG. 7B depicts a process of ascending of the capillary 150.

1. The capillary 150 undergoes first bonding, for example, onto a bonding pad 151 of a semiconductor chip, and subsequently moves as shown by arrows 155, 156 and 157. As shown in FIG. 7B, this causes a thin metal wire to form a thin metal wire extending obliquely to the right and then extending upward.

2. The capillary 150 is moved to the right as shown by an arrow 158 in FIG. 7A. This causes the thin metal wire to form a parabola protruding to the left, as shown in FIG. 7C.

3. The capillary 150 is moved upward up to a certain height as shown by an arrow 159 in FIG. 7A, is subsequently moved in a horizontal direction as shown by an arrow 160, and is further moved downward in a vertical direction as shown by an arrow 161. This forms a trough 165 in the center of the M-loop as shown in FIG. 7F.

4. The capillary 150 is moved in the vertical direction as shown by an arrow 162 in FIG. 7A, and the thin metal wire is held by a clamper provided together with the capillary 150 and undergoes second bonding onto an upper surface of the electrode 152 while forming a loop as shown by an arrow 163. This enables formation of the M-loop as shown in FIG. 7F.

DISCLOSURE OF THE INVENTION

With the aforementioned conventional technique, a bend portion 166 in FIG. 7H can be formed to be located outside a chip end 110, and the height of the thin metal wire can be reduced, while a distance between the chip end 110 and the thin metal wire 104B can be obtained.

In other words, a package can be made thin, and the short-circuit of the thin metal wire can also be prevented.

However, advancement of mobile equipment requires further reduction in weight and size, and a connection method using a further lower loop.

The present invention provides a semiconductor device including at least: a semiconductor chip having a bonding pad; an electrode placed around the semiconductor chip; and a thin metal wire that electrically connects the bonding pad and the electrode. In the above semiconductor device, the thin metal wire comprises a curve portion one end of which is connected to the bonding pad and a top portion of which is curved upward, and an extending portion that is continuous with the curve portion through a bend portion and is extended linearly toward the electrode.

The present invention further provides a semiconductor device including at least: a semiconductor chip having a bonding pad; an electrode placed around the semiconductor chip; and a thin metal wire that electrically connects the bonding pad and the electrode. In the above semiconductor device, the thin metal wire comprises a first extending portion one end of which is connected to the bonding pad and a top portion of which is curved upward, a second extending portion that is continuous with the first extending portion through a bend portion and is extended linearly toward the electrode, and a third extending portion is extended downward to the electrode from an end portion of the second extending portion.

The present invention further provides a semiconductor device manufacturing method in which a semiconductor chip and an electrode placed around the semiconductor chip are electrically connected with a thin metal wire by using a bonder including at least a capillary, spark means located near an end portion of the capillary, and a clamper. The method comprises the steps of: when the spark means forms a metal ball at an end portion of the capillary, controlling a length of a hard portion of a thin metal wire extended from the metal ball, by controlling a period of time in which a current flows into the spark means, the hard portion being formed of a recrystallized portion; connecting the metal ball to a bonding pad of the semiconductor chip; and by using the capillary, bending a thin metal wire integral with the metal ball so as to form a first extending portion, a bend portion and a second extending portion, the first extending portion being a curve portion exhibiting a trajectory in which a top portion thereof is curved upward, the bend portion provided at a terminal end portion of the first extending portion, the second extending portion extended linearly toward the electrode. In the above method, in the step of bending the thin metal wire, a terminal end region of the hard portion is located in the bend portion or at a position shifted to the semiconductor chip from the bend portion.

When the thin metal wire between the bonding pad of the semiconductor chip and the electrode forms the curve portion having the trajectory being a substantially cut circle or a semi-ellipse (upper half obtained by cutting off a part of an ellipse) on the first bond and the vicinity thereof, the bend portion can be formed at the end of the curve portion.

This enables a horizontal portion that is horizontal and lower than the top portion of the curve portion to be extended to a second bond side from the bend portion. Accordingly, the height of the loop of the thin metal wire can be reduced and consequently the semiconductor device can be made thin.

This can be implemented by a highly reliable wire bonding method accumulated over the history from the past, and thus a highly reliable package can be implemented despite a thin package.

Moreover, this bend portion can be adjusted by spark means, of the bonder, for forming a metal ball. In other words, with this spark means, the hard portion being the recrystallized portion can be made short or long. If the hard portion is made short, the height of the curve portion can be made low, and the bend portion is easily formed at an interface between the hard portion and a softer portion and in a vicinity of the interface. Accordingly, the shapes of the thin metal wires shown in FIGS. 1 and 2 can be obtained.

BRIEF DESCRIPTION OF THE DRAWINGS

FIGS. 4A, 4B and 4C are views illustrating a manufacturing method of the preferred embodiment of the present invention;

FIG. 5 is a view illustrating the manufacturing method of the preferred embodiment of the present invention;

FIGS. 6A, 6B and 6C are views illustrating the manufacturing method of the preferred embodiment of the present invention;

FIGS. 7A-7H are views illustrating a conventional wire loop; and

BEST EMBODIMENT FOR CARRYING OUT THE INVENTION

Figure 8:
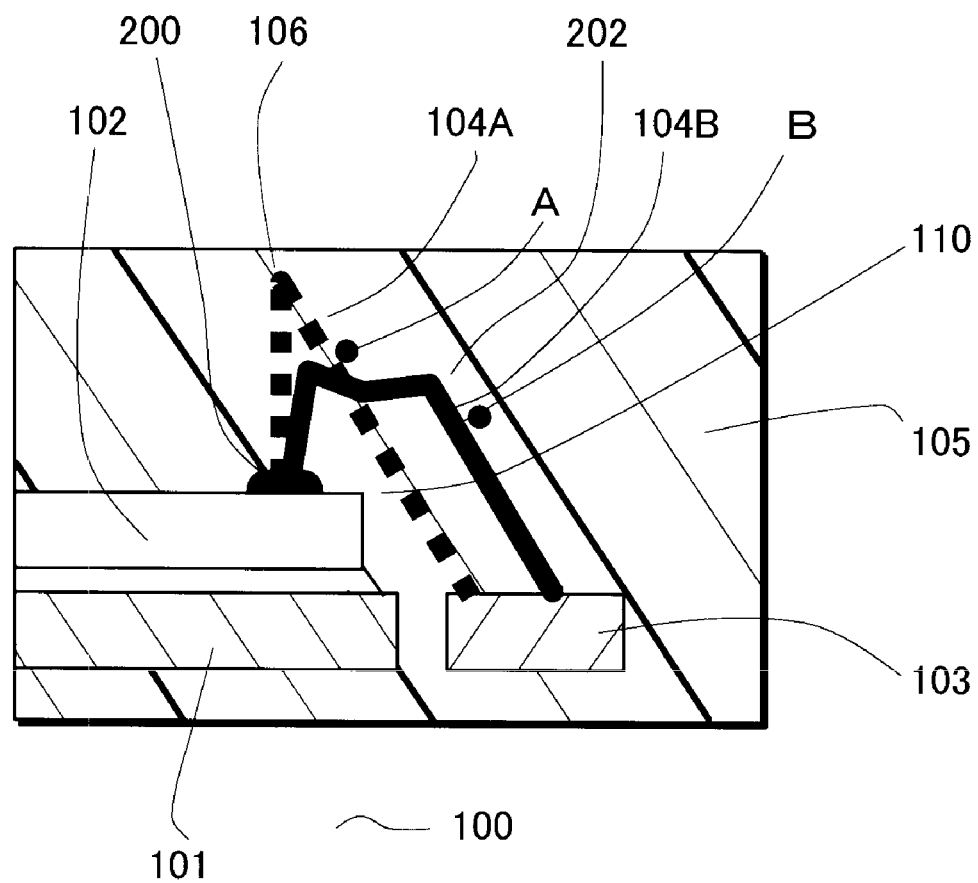
FIG. 8 is a view illustrating the conventional semiconductor device.

A loop of a wire using a thin metal wire is shown by a dotted line in FIG. 8 and generally exhibits a triangular loop. This is because the thin metal wire is ball-bonded at a portion of a first bond 200, is subsequently extended upward, is thereafter provided with a bend portion at a top portion 106, and is afterwards extended obliquely downward. Thus, the thin metal wire generally exhibits the triangular loop.

Another loop is shown by a solid line in FIG. 8 similarly. In a simple thought, when the top portion 106 of a thin metal wire 104A of the triangular loop is pushed down from the above, a head portion thereof can be shaped like a letter M. However, a trajectory, of a thin metal wire 104B, extending from a bend portion 202 to a second bond draws a substantially linear trajectory (hereinafter referred to as a linearly extending portion) extending obliquely downward, like the triangular loop 104A. Accordingly, in the triangular loop and the M-loop, the linearly extending portions, specifically, portions shown by leader lines of the reference numerals 104A and 104B are likely to contact a corner of a chip, although the degree might vary between the triangular loop and the M-loop.

In order to solve the above problem, there is conceivable a structure in which parts of these respective linearly extending portions 104A and 104B are extended horizontally. For example, if the thin metal wire 104A and the thin metal wire 104B are extended horizontally from a black dot A and a black dot B, respectively, a short circuit occurring around the chip, i.e., at a corner of the chip can be prevented.

Figure 1:
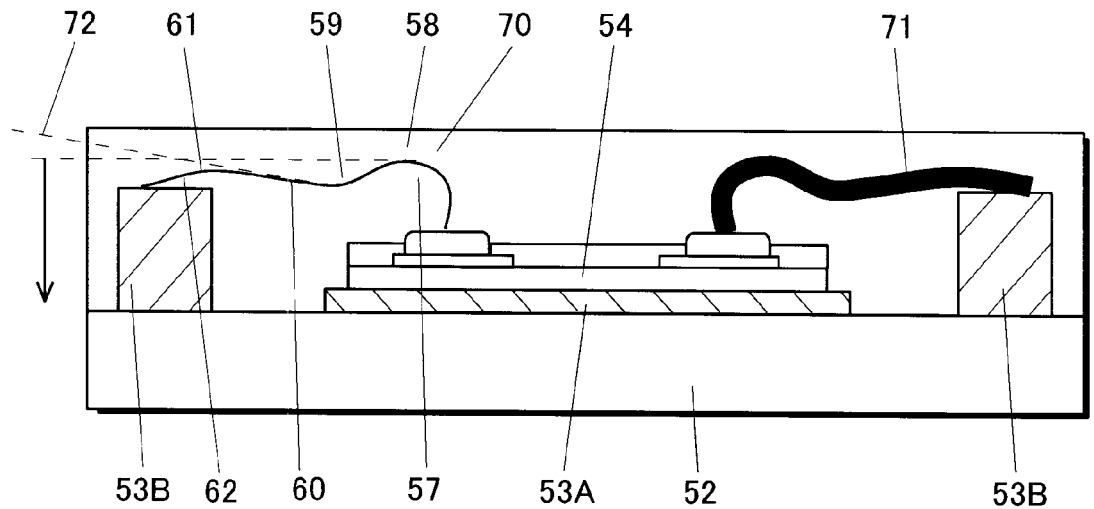
FIG. 1 is a view illustrating a semiconductor device of a preferred embodiment of the present invention.

In a preferred embodiment of the present invention, this point is taken into consideration, and moreover a wire loop having a low top portion is formed. FIGS. 1 and 3 each illustrate a structure of a semiconductor device to which the present invention is applied, and FIG. 2 and FIGS. 4 to 6 each illustrate a concrete structure of the semiconductor device or a method of manufacturing the semiconductor device.

Figure 2:
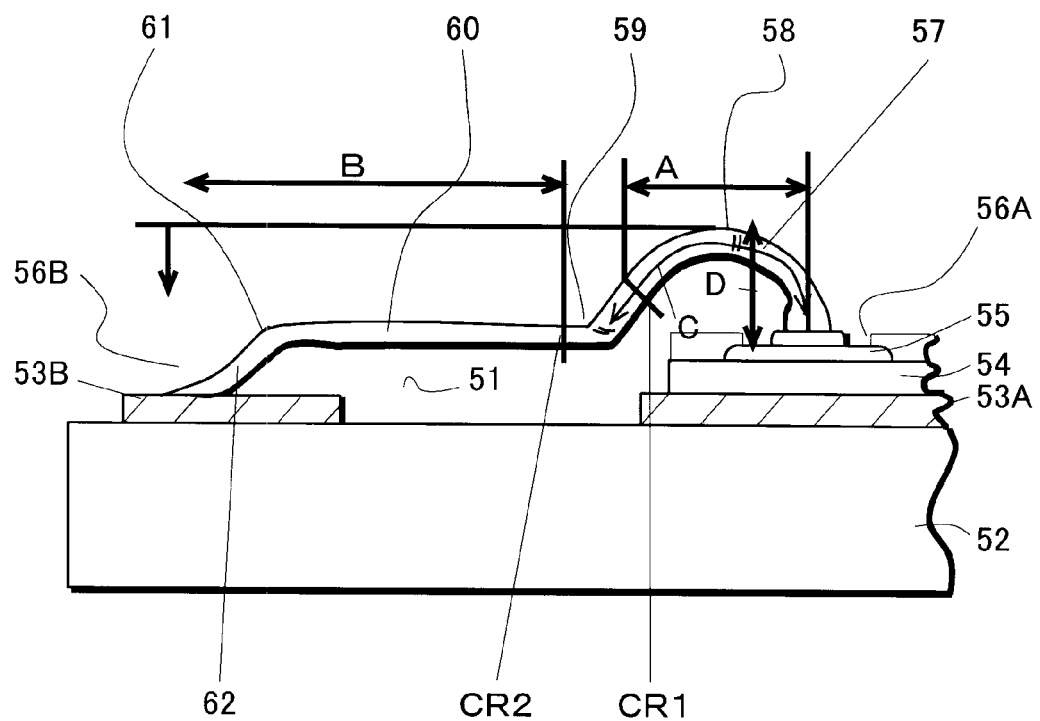
FIG. 2 is a view illustrating a wire loop of a thin metal wire employed by the preferred embodiment of the present invention.

First, a description is given of a shape of a thin metal wire 51 with reference to FIG. 2. Here, as an electrode to be electrically connected to the thin metal wire 51, an inner lead of a lead frame, an electrode provided on a mounting substrate 52, or the like can be conceived. In the drawing, a mounting substrate is employed.

As the mounting substrate 52, there is conceivable a resin substrate that is a printed board, a flexible sheet or the like, a ceramic substrate, a glass substrate, a metal substrate, an Si substrate or the like. The resin substrate mainly employs an epoxy resin, a polyimide resin, or the like, but is not limited to these. The ceramic substrate mainly employs an alumina sintered body, but the material is not limited as long as the material is an insulating material. The metal substrate employs an aluminum substrate or a Cu substrate, and an insulating film is formed on a surface of the substrate in consideration of insulation from a conductive pattern. Meanwhile, an Si substrate is generally referred to as an Si interposer, and the substrate itself is made of Si so that a thermal expansion coefficient can match that of a semiconductor chip to be mounted. Since Si is a semiconductor material, a surface thereof is generally covered with an Si oxide film. This Si oxide film and the like are formed by thermal oxidization, CVD, sputtering, or the like.

Meanwhile, in any of the mounting substrates, a conductive pattern heavily using through holes may be formed in multiple layers. In this case, electrodes 53A and 53B shown in the drawing may be regarded as ones mainly made of Cu and formed on an uppermost layer.

Here, the electrode 53A serves as an island, because a semiconductor chip 54 is mounted thereon here. In this regard, an adhesive material for fixing a back surface of the semiconductor chip 54 onto a front surface of the electrode 53A employs a conductive adhesive material such as solder or a conductive paste, or an insulating adhesive material. When a back surface of the semiconductor chip 54 has a certain fixed voltage, a conductive adhesive material is employed as the adhesive material therefor. On the other hand, when the semiconductor chip 54 has an electrically floating back surface, the semiconductor chip 54 is mounted by use of an insulating adhesive. The electrode 53B is made of, for example, Cu, and a surface thereof is covered with, for example, Ni and then Au, so as to support second bonding.

The semiconductor chip 54 may be a discrete type transistor, IC, or the like, and a bonding pad 55 is exposed from an uppermost surface of the semiconductor chip 54. This bonding pad 55 of the thin metal wire 51 is a first bond 56A, and one end of the thin metal wire 51 is connected thereto by ball bonding. By contrast, the other end of the thin metal wire 51 is connected to a second bond 56B (an upper surface of the electrode 53B) to undergo stitch bonding.

From a base of a portion to which this one end of the thin metal wire 51 is ball-bonded, the thin metal wire 51 protrudes upward, forming substantially a curve portion 57 including a top portion 58 thereof. A trajectory shape of the thin metal wire 51 is a shape obtained by cutting off a part of a circle or a shape obtained by cutting off a part of an ellipse. In other words, the curve portion 57, as a first extending portion 57, starts from the first bond at one end thereof, and ends at the other end 59 of the curve portion 57. Here, the curve portion may have a triangle-like shape.

The other end 59 of the curve portion 57 is also a bend portion of the thin metal wire 51, and the thin metal wire 51 is linearly extended as a second extending portion 60 to the left side (electrode 53B side) of the drawing plane. The second extending portion 60 extends in parallel to an upper surface of the mounting substrate 52 (i.e., extends horizontally). Specifically, since the electrode 53B is located lower than the second extending portion 60, a second bend portion 61 is formed at the other end of the second extending portion, and the second extending portion 60 extends down to the electrode 53B to undergo the second bonding. A portion extending obliquely downward from the second bend portion 61 to the electrode 53B is a third extending portion 62.

Here, the length along the thin metal wire 51 from a metal ball to the first bend portion 59 is approximately 100 μm±10 μm, and the height from a surface of the bonding pad 55 to the top portion of the curve portion is approximately 60 μm to 70 μm. Concretely explaining, the length of an arrow line C of the curve portion 57 is 100 μm±10 μm, and an arrow D line (the length from the top portion 58 to the pad 55) is 60 μm to 70 μm. Accordingly, the shape of the curve portion 57 is not so much a perfect circle as an ellipse. Incidentally, the shape of the curve portion 57 also looks like a part obtained by cutting a circle or an ellipse.

The present invention has significance in formation of the curve portion 57. In other words, there is significance in that the curve portion 57 enables metal shaping at the other end 59 of the curve portion 57, allowing provision of the horizontal or linear second extending portion 60. For example, when this second extending portion 60 undergoes the second bonding without extending above the height of the top portion 58, this series of wire loop is determined by the top portion 58.

Further, a description is given of the shape of the thin metal wire 51 with reference to a thin metal wire 70 on the left side in FIG. 1. The thin metal wire 70 on the left side employs the same wire as a thin metal wire 71 on the right side. However, the thin metal wire 70 is shown by a thin line in FIG. 1 for illustrating the location relationship. A dotted thin line 72 indicates that the second extending portion 60 is extended substantially linearly. The third extending portion 62 extends down at any rate. Accordingly, if the second bend portion 61 between these portions is set lower than the top portion 58, the height of the thin metal wire 70 is determined by the top portion 58. In this manner, the second bend portion 61 only needs to be located within a range of location lower than the top portion 58 of the curve portion 57, and the linear second extending portion 60 may be extended slightly obliquely upward. As a matter of course, the second extending portion 60 may be extended horizontally or downward.

Although depending on the need, if resin encapsulation is required for the semiconductor device, the entire mounting substrate 52 is encapsulated with an insulating resin. This is implemented by podding, transfer molding, injection molding, or the like. Additionally, in a case of encapsulating the mounting substrate 52 with a housing, a hollow might be provided therein. Hence, there is a case where resin is not provided on a surface of the mounting substrate 52.

As described above, FIG. 1 shows a modification of FIG. 2. The second bond is located higher than the first bond. Specifically, the thickness of the electrode 53B is increased so that the height of the electrode 53B may exceed that of a bonding pad on the semiconductor chip 54. This keeps the first bend portion 59 away from the semiconductor chip 54 or the corner of the semiconductor chip 54. As described above, there are provided the curve portion 57, the first bend portion 59, the second extending portion 60 which extends obliquely upward but is linear, the second bend portion 61, and the third extending portion 62.

The second bend portion 61 is provided so as to be located lower than the top portion 58, and the thin metal wire 70 extends down to the second bond from the second bend portion 61. Therefore, the thickness of the entire package is determined by the size of the curve portion 57.

Subsequently, how to determine the size of this curve portion 57 is described. FIG. 4 illustrates the determination method. FIGS. 4A and 4B each show a layout in which the thin metal wire 71 is placed in a wire bonder 70. A capillary 72 is a head for bonding, and a clamper 73 is for holding the thin metal wire 71 when the thin metal wire 71 is severed. In addition, a reference numeral 74 located near an end of the thin metal wire 71 denotes spark means. Generally, these three means are attached to the bonder integrally.

The thin metal wire 71 passes through a hollow portion in the center of the capillary 72, and a predetermined length of the thin metal wire 71 is put out from an end portion of the capillary 72. The spark means 74 is melting means, and forms an end portion of the thin metal wire 71 into a ball shape as in FIG. 4B.

The point is that forming of the metal ball depends on a spark current value and discharge time. This melted portion is cooled after reaching a high temperature. Thereby, a recrystallized portion in a polycrystalline state is formed in the thin metal wire 71 as shown by hatching in dots in FIG. 4B. This portion is generally heated and then cooled, thus corresponding to a hardened portion. For example, this portion is referred to as Heat Affected Zone (heat affected zone) and acronymed HAZ in a product catalogue of TANAKA DENSHI KOGYO K.K. This portion is necessarily generated as long as a general bonder is used. The length of this portion, of the thin metal wire 71, where a polycrystal is formed is approximately 85 μm to 130 μm, for example.

As shown in FIG. 4C, the following experiments were made by using Au wires made of materials shown below, i.e., GLF and GMG. While the spark current value and discharge time were set constant to 27.5 mA and 0.5 msec, respectively, the lengths of HAZ were checked. The diameter of both the wires is 23 μm. The heating and cooling conditions were regarded as the same conditions for both the wires, because the same equipment was used.

Results showed that the lengths of HAZ were 110 μm to 130 μm in the case of GLF, and 150 μm to 170 μm in the case of GMG, and that the heights of the loops were 62 μm and 70 μm, respectively.

Meanwhile, the thin metal wire 71 such as the Au wire is categorized into various types, and the catalogue describes categorization into the following types, for example. Briefly explaining according to the catalogue, GMG and GMH are high strength Au wires, GLF is a super low loop Au wire, and GFC and GFD are fine pitch Au wires. Thus, the thin metal wire 71 is categorized into various types.

From this, it is presumable that GMG might have a dense crystalline structure and a high thermal conductivity, because GMG has high hardness and is harder than GLF.

Additionally, it is possible to change the length of HAZ by changing the spark current with the discharge time fixed, by changing the discharge time with the spark current fixed, or by changing both. Moreover, to change the thermal emission properties of the capillary, another material may be selected, or the cooling or heat-retention performance of the capillary may be made dependent on separately provided mechanical means. This can be adjusted by an amount of energy in melting and the speed of the subsequent cooling.

As shown in FIG. 4C, it is understood that the shorter HAZ, the lower the loop. This can explain the following, although not applied to all. That is, it is considered that, when thin metal wires made of the same material and having different lengths of HAZ are prepared, a thin metal wire having a longer HAZ has a higher loop. In other words, it is considered as one reason that if the metal thin layer 71 is hard, process shaping is hampered, resulting in correspondingly higher length.

The thin metal wire 71 is divided into two regions: the recrystallized portion which is a hard portion, and a non-recrystallized portion which is softer than the recrystallized portion. A description is given here by referring to an interface therebetween as Z. As an extreme case, assume that an only-20-cm-long cord made of a fiber is prepared, and only-5-cm-long portion from the right end of the cord is impregnated with an adhesive. In other words, a cord consisting of a hard right 5-cm portion and a soft left 15-cm portion is prepared. If the soft portion of the cord is lifted, the cord would bend at the interface Z. Meanwhile, being capable of plastic deformation, a thin metal wire is likely to bend in a vicinity close to Z.

Let us see where Z is actually located. The location of Z is an arrow shown in FIG. 2. This means that a portion shown by an arrow A is the recrystallized portion (hard portion), and Z is located on a thick line CR1 in some case or a thick line CR2 in other case. This is because the first bend portion 59 is formed by a capillary 72 to be described later, and thus the first bend portion 59 is slightly shifted from the interface Z to a second bond side. In other words, the interface Z in the thin metal wire 51 is preferably located on the first bend portion 59 or at a position shifted toward the semiconductor chip from the first bend portion 59.

Providing the first bend portion 59 in the soft portion on the second bond side of the interface as described above requires a smaller external force (stress) to be used for this process. Thereby, a smaller stress is applied to the first bond, thus enhancing the reliability.

One way or another, the second extending portion 60 and the third extending portion 62 can be located lower than the top portion 58 by forming the curve portion 57 in the hard recrystallized portion and by forming the bend portion 59 at the other end of this curve portion 57.

FIG. 5 shows a trajectory of a capillary 150, and FIG. 6 shows the shape of a thin metal wire formed consequently.

1. As shown in FIG. 5, the capillary 150 undergoes the first bonding onto, for example, a bonding pad on a semiconductor chip, is subsequently extended obliquely to the upper right, and thereafter moves obliquely to the upper left through a bend portion 80 while making a certain angle. Thereby, the thin metal wire forms a parabola protruding to the right, as shown in FIG. 6A.

2. As shown in FIG. 5, after moving obliquely to the upper right through a bend portion 81, the capillary 150 moves downward through a bend portion 82 and furthermore moves obliquely to the upper left through a bend portion 82'. Here, a distance between the bend portions 82 and 82' is set to be very short. As a result, as shown in FIG. 6B, the thin metal wire exhibits a linear second extending portion at the other end of a curve portion through the bend portion 82 and shows a shape just like a fishhook.

3. The capillary 150 is lowered as shown by an arrow 83, while having a long linear portion, as shown in FIG. 5. This lowers an end portion of the thin metal wire extending obliquely upward, as shown in FIG. 6C, to form a shape shown in FIG. 2.

As described above, the top portion of the thin metal wire is determined by the curve portion by providing the fishhook-like curve portion and the linear extending portion. Accordingly, if this curve portion is made as small as possible, the top portion can be lowered further.

Figure 3A:
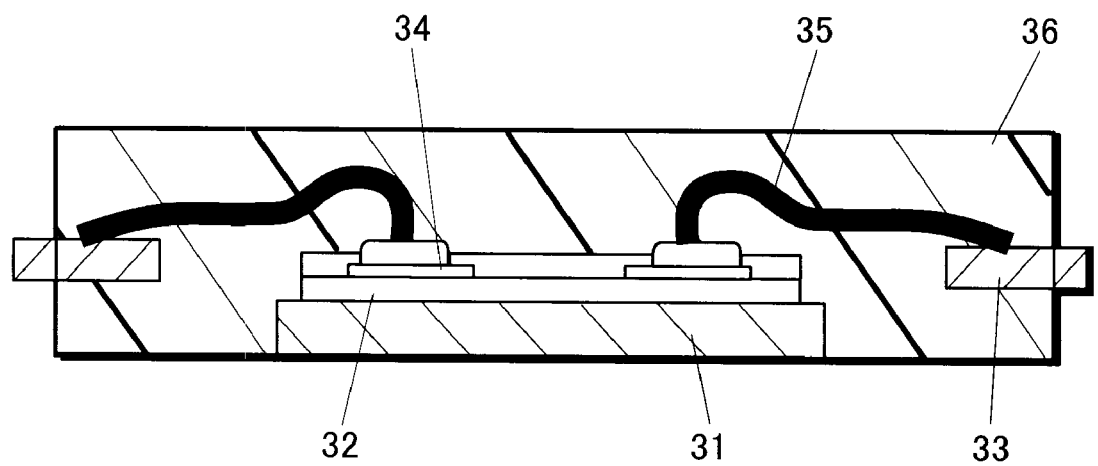
FIGS. 3A and 3B are views illustrating the semiconductor device of the preferred embodiment of the present invention.

FIG. 3A shows application of this fishhook-shaped wire loop to a package employing lead frames. A semiconductor chip 32 is fixed onto an island 31, and inner leads 33 are arranged near the island 31 with one end of each of the inner leads 33 located close to the island 31. Formed are thin metal wires 35 each to undergo the first bonding onto a bonding pad 34 of the semiconductor chip 32 and the second bonding onto the inner lead 33. Furthermore, there is provided resin 36 for encapsulating a surface of the island, the semiconductor chip, the thin metal wires and the inner leads.

The thin metal wires 35 have the shape shown in FIG. 2, and thus the height of the wire loop can be set low. Accordingly, a package can be made thin.

Figure 3B:
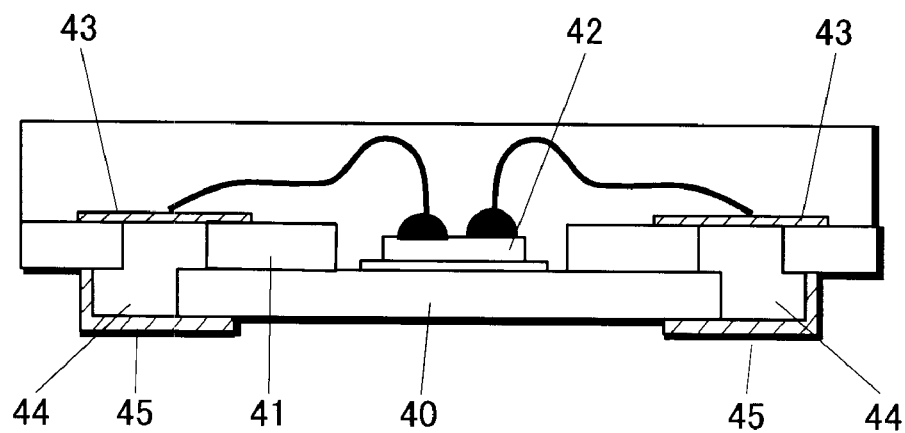

FIG. 3B similarly shows application of this fishhook-shaped wire loop to a ceramic substrate. Ceramic substrates 40 and 41 made of alumina are stacked. The lower ceramic substrate 40 has, in a central portion thereof, an arrangement region for a ceramic chip 42, whereas the upper ceramic substrate 41 does not. An insulating or conductive adhesive is provided on this arrangement region to fix the semiconductor chip 42 thereto. Meanwhile, around the arrangement region for the semiconductor chip 42, the upper ceramic substrate 41 is located, and electrodes 43 are provided thereon. Here, the electrodes 43 are formed by sintering Ni and Au in this order from below. Furthermore, a through hole 44 is provided under each electrode 43, and filled with a metal such as W (tungsten) here. This W is exposed to an end portion of the lower ceramic substrate 40, and electrodes 45 made of Au are formed so as to cover a back surface and a side portion of W.

In addition, bonding pads on the semiconductor chip 42 are respectively connected to the electrodes 43 via thin metal wires of the preferred embodiment of the present invention. The thin metal wires have the shape shown in FIG. 2 and thus the height of the wire loop can be set low. This can make a package thin. Here, since the two stacked ceramic substrates are slightly arched protruding upward, a surface of the semiconductor chip is set lower than the electrode 43.
31 ISLAND
32 SEMICONDUCTOR CHIP
33 INNER LEAD
34 BONDING PAD
35 THIN METAL WIRE
36 ENCAPSULATING RESIN
40 CERAMIC SUBSTRATE
41 CERAMIC SUBSTRATE
42 SEMICONDUCTOR CHIP
43 ELECTRODE
44 THROUGH HOLE
45 ELECTRODE
51 THIN METAL WIRE
52 MOUNTING SUBSTRATE
53A ELECTRODE
53B ELECTRODE
54 SEMICONDUCTOR CHIP
55 BONDING PAD
56A FIRST BOND
56B SECOND BOND
57 CURVE PORTION
58 TOP PORTION
59 THE OTHER END OF BEND PORTION (FIRST BEND PORTION)
60 SECOND EXTENDING PORTION
61 SECOND BEND PORTION
62 THIRD EXTENDING PORTION
70 WIRE BONDER
71 THIN METAL WIRE
72 CAPILLARY
74 REFERENCE NUMERAL
80 BEND PORTION
81 BEND PORTION
82 BEND PORTION
83 ARROW
100 SEMICONDUCTOR DEVICE
101 ISLAND
102 SEMICONDUCTOR CHIP
103 LEAD
104A THIN METAL WIRE (TRIANGULAR LOOP)
104B THIN METAL WIRE (M-LOOP)
105 ENCAPSULATING RESIN
106 TOP PORTION
110 CHIP END
150 CAPILLARY
151 BONDING PAD
155 ARROW
156 ARROW
157 ARROW
158 ARROW
159 ARROW
160 ARROW
161 ARROW
162 ARROW
163 ARROW
165 TROUGH
166 BEND PORTION
200 FIRST BOND
202 BEND PORTION
CR1 THICK LINE
CR2 THICK LINE
A ARROW
C ARROW LINE FOR BEND PORTION
D ARROW
Z INTERFACE

The invention claimed is:

1. A semiconductor device comprising:
a semiconductor chip having a bonding pad;
an electrode placed around the semiconductor chip; and
a thin metal wire that electrically connects the bonding pad and the electrode, wherein
the thin metal wire comprises a curve portion one end of which is connected to the bonding pad and a top portion of which is curved upward, and an extending portion that is continuous with the curve portion through a bend portion and is extended linearly toward the electrode,
the thin metal wire comprises two regions, a hard portion and a soft portion, and an interface between the hard portion and the soft portion is provided in or near the bend portion, and
the interface between the hard portion and the soft portion is provided shifted towards the electrode from the bend portion.

2. The semiconductor device according to claim 1, wherein a height from a surface of the electrode to the top portion of the curve portion is not more than 70 μm.

3. The semiconductor device according to claim 1, wherein a trajectory of the curve portion exhibits any one of a part of a circle and a part of an ellipse.

4. The semiconductor device according to claim 1, wherein the hard portion is a recrystallized portion and the soft portion is a non-recrystallized portion.

5. A semiconductor device comprising:
a semiconductor chip having a bonding pad;
an electrode placed around the semiconductor chip; and
a thin metal wire that electrically connects the bonding pad and the electrode, wherein
the thin metal wire comprises a first extending portion one end of which is connected to the bonding pad and a top portion of which is curved upward, a second extending portion that is continuous with the first extending portion through a bend portion and is extended linearly toward the electrode, and a third extending portion is extended downward to the electrode from an end portion of the second extending portion,
the thin metal wire comprises two regions, a hard portion and a soft portion, and an interface between the hard portion and the soft portion is provided in or near the bend portion, and
the interface between the hard portion and the soft portion is provided shifted towards the electrode from the bend portion.

6. The semiconductor device according to claim 5, wherein a height from a surface of the electrode to the top portion of the first extending portion is not more than 70 μm.

7. The semiconductor device according to claim 5, wherein an interface between the second extending portion and the third extending portion is provided at the same height as the top portion or below the top portion.

8. The semiconductor device according to claim 5, wherein the hard portion is a recrystallized portion and the soft portion is a non-recrystallized portion.

9. A semiconductor device manufacturing method in which a semiconductor chip and an electrode placed around the semiconductor chip are electrically connected with a thin metal wire by using a bonder including at least a capillary, spark means located near an end portion of the capillary, and a clamper, the method comprising the steps of:

when the spark means forms a metal ball at an end portion of the capillary, controlling a length of a hard portion of a thin metal wire extended from the metal ball, by controlling a period of time in which a current flows into the spark means, the hard portion being formed of a recrystallized portion;

connecting the metal ball to a bonding pad of the semiconductor chip; and by using the capillary, bending a thin metal wire integral with the metal ball so as to form a first extending portion, a bend portion and a second extending portion, the first extending portion being a curve portion exhibiting a trajectory in which a top portion thereof is curved upward, the bend portion provided at a terminal end portion of the first extending portion, the second extending portion extended linearly toward the electrode, wherein in the step of bending the thin metal wire, a terminal end region of the hard portion is located in or near the bend portion, and the interface between the hard portion and the soft portion is provided shifted towards the electrode from the bend portion.

10. A semiconductor device comprising:
a semiconductor chip having a bonding pad;
an electrode placed around the semiconductor chip; and
a thin metal wire that electrically connects the bonding pad and the electrode, wherein
the thin metal wire comprises a curve portion one end of which is connected to the bonding pad and a top portion of which is curved upward, and an extending portion that is continuous with the curve portion through a bend portion and is extended linearly toward the electrode,
the thin metal wire comprises two regions, a hard portion and a soft portion, and an interface between the hard portion and the soft portion is provided in or near the bend portion,
the hard portion is a recrystallized portion and the soft portion is a non-recrystallized portion, and
said curve portion is formed in said hard portion that is a recrystallized portion.

11. The semiconductor device according to claim 10, wherein said bend portion is formed in said soft portion that is a non-recrystallized portion.

12. A semiconductor device comprising:
a semiconductor chip having a bonding pad;
an electrode placed around the semiconductor chip; and
a thin metal wire that electrically connects the bonding pad and the electrode, wherein
the thin metal wire comprises a first extending portion one end of which is connected to the bonding pad and a top portion of which is curved upward, a second extending portion that is continuous with the first extending portion through a bend portion and is extended linearly toward the electrode, and a third extending portion is extended downward to the electrode from an end portion of the second extending portion,
the thin metal wire comprises two regions, a hard portion and a soft portion, and an interface between the hard portion and the soft portion is provided in or near the bend portion,
the hard portion is a recrystallized portion and the soft portion is a non-recrystallized portion, and
said curve portion is formed in said hard portion that is a recrystallized portion.

13. The semiconductor device according to claim 12, wherein said bend portion is formed in said soft portion that is a non-recrystallized portion.

14. The semiconductor device according to any one of claims 10 and 12, wherein
said interface between the hard portion and the soft portion is provided in the bend portion or at a position slightly shifted toward the semiconductor chip from the bend portion.

15. The semiconductor device according to any one of claims 1, 5, 10 and 12, wherein
the semiconductor chip is mounted on a mounting substrate that is any one of a ceramic substrate, a printed board, a flexible sheet substrate and a silicon interposer,
the electrode is formed by a conductive pattern provided on an upper surface of the mounting substrate, and
a resin for overall encapsulation is provided.

16. The semiconductor device according to any one of claims 1, 5, 10 and 12, wherein
a resin that encapsulates the semiconductor chip, the electrode and the thin metal wire is provided, and
the electrode is formed of a conductive plate and exposed from the resin to the outside.

* * * * *